(12) United States Patent
Sapp

(10) Patent No.: US 6,351,018 B1
(45) Date of Patent: Feb. 26, 2002

(54) MONOLITHICALLY INTEGRATED TRENCH MOSFET AND SCHOTTKY DIODE

(75) Inventor: Steven Paul Sapp, Felton, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 09/267,921

(22) Filed: Feb. 26, 1999

(51) Int. Cl.[7] ........................ H01L 29/00; H01L 21/338
(52) U.S. Cl. ...................... 257/499; 257/342; 257/479; 257/331; 257/155; 438/179
(58) Field of Search ................... 257/499, 342, 257/479, 331, 471, 341, 329, 155, 146, 328; 438/179

(56) References Cited

U.S. PATENT DOCUMENTS

| | | | |
|---|---|---|---|
| 4,811,065 A | | 3/1989 | Cogan ........................ 357/23.4 |
| 4,903,189 A | | 2/1990 | Ngo et al. .................... 363/127 |
| 4,956,308 A | * | 9/1990 | Griffin et al. ................. 438/179 |
| 5,111,253 A | * | 5/1992 | Korman et al. .............. 257/479 |
| 5,365,102 A | | 11/1994 | Mehrota et al. .............. 257/475 |
| 5,818,084 A | * | 10/1998 | Williams et al. ............. 257/329 |
| 5,929,690 A | | 7/1999 | Williams ...................... 327/374 |
| 5,998,833 A | | 12/1999 | Baliga ......................... 257/329 |
| 6,049,108 A | * | 4/2000 | Williams et al. ............. 257/341 |
| 6,096,629 A | * | 8/2000 | Tsai et al. .................... 438/570 |

OTHER PUBLICATIONS

"The Graded Doped Power UMOSFET," Mahalingam et al., *Power Semiconductor Research Center Annual Report*, pp. 68–71, North Carolina State University, 1968.

"A Low Forward Drop High Voltage Trench MOS Barrier Schottky Rectifier with Linearly Graded Doping Profile," Mahalingam et al., PRSC Document TR–97–030, Power Semiconductor Research Center, North Carolina State University, 1997.

\* cited by examiner

*Primary Examiner*—Matthew Smith
*Assistant Examiner*—Igwe U. Anya
(74) *Attorney, Agent, or Firm*—Townsend and Townsend and Crew LLP

(57) ABSTRACT

A monolithically integrated Schottky diode together with a high performance trenched gate MOSFET. A MOS enhanced Schottky diode structure is interspersed throughout the trench MOSFET cell array to enhance the performance characteristics of the MOSFET switch. The forward voltage drop is reduced by taking advantage of the low barrier height of the Schottky structure. In a specific embodiment, the width of the trench is adjusted such that depletion in the drift region of the Schottky is influenced and controlled by the adjacent MOS structure to increase the reverse voltage capability of the Schottky diode.

24 Claims, 4 Drawing Sheets

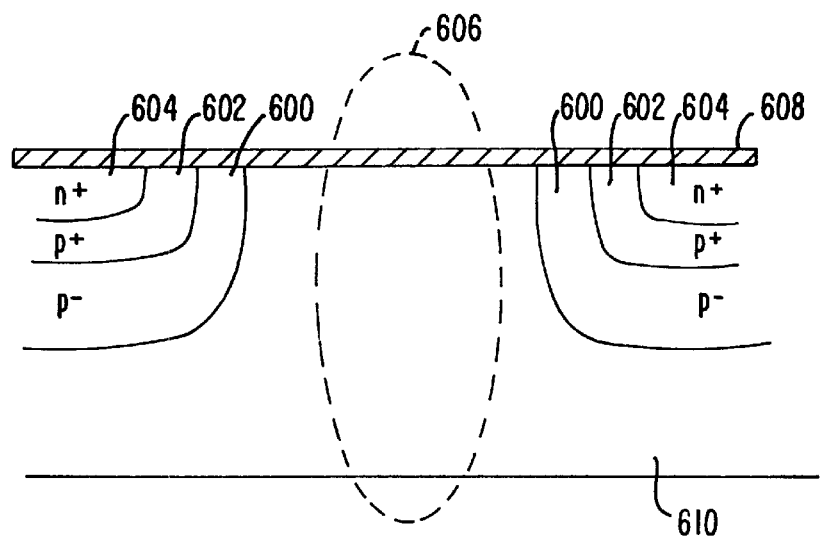
FIG. 6.
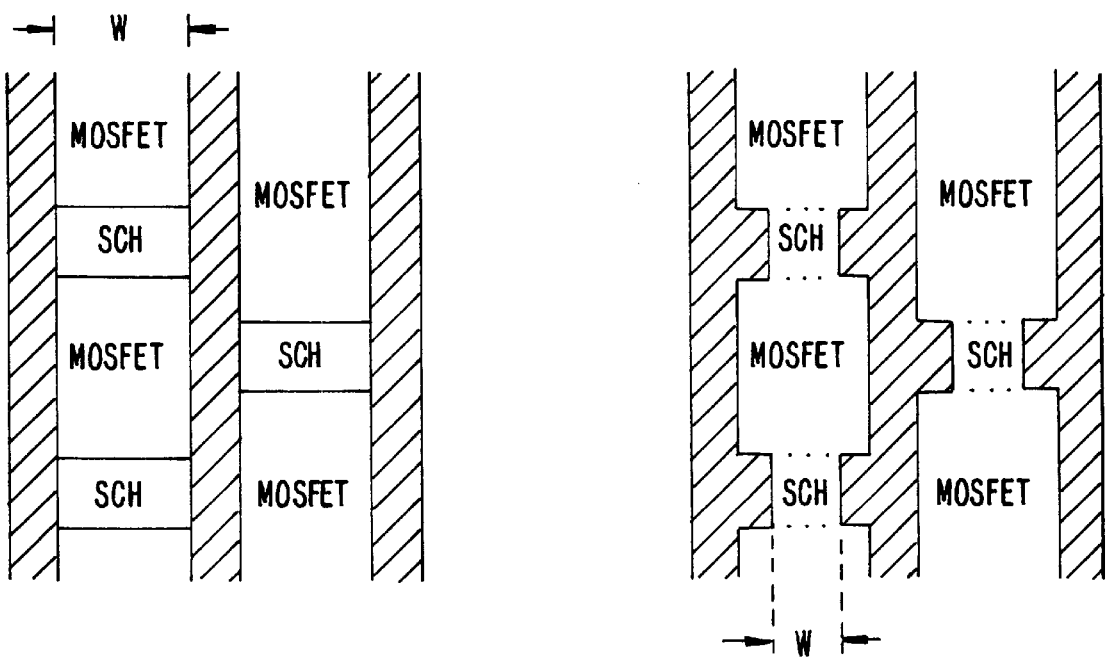
FIG. 7A.
FIG. 7B.

MONOLITHICALLY INTEGRATED TRENCH MOSFET AND SCHOTTKY DIODE

BACKGROUND OF THE INVENTION

The present invention relates in general to semiconductor technology, and in particular to a semiconductor device with a monolithically integrated trenched gate MOSFET and SCHOTTKY diode, and its method of manufacture.

In today's electronic devices it is common to find the use of multiple power supply ranges. For example, in some applications, central processing units are designed to operate with a different supply voltage at a particular time depending on the computing load. Consequently, dc/dc converters have proliferated in electronics to satisfy the wide ranging power supply needs of the circuitry. Common dc/dc converters utilize high efficiency switches typically implemented by power MOSFETs such as those manufactured by Fairchild Semiconductor. The power switch is controlled to deliver regulated quanta of energy to the load using, for example, a pulse width modulated (PWM) methodology.

Referring to FIG. 1, there is shown a simplified circuit schematic for a conventional dc/dc converter. A PWM controller 100 drives the gate terminals of a pair of power MOSFETs Q1 and Q2 to regulate the delivery of charge to the load. MOSFET switch Q2 is used in the circuit as a synchronous rectifier. In order to avoid shoot-through current, both switches must be off simultaneously while one is turning on and the other turning off. During this dead time, the internal diode of each MOSFET switch can conduct current. Unfortunately this diode has relatively high conduction voltage and energy is wasted. To improve the conversion efficiency of the circuit a Schottky diode 102 is often externally added in parallel with the MOSFET (Q2) diode. Because it has superior conduction voltage characteristics, Schottky diode 102 effectively replaces the MOSFET diode eliminating the forward biasing of the MOSFET diode.

Implementing the Schottky diode external to the MOSFET switch package was for many years the preferred solution. More recently, some manufacturers have introduced products in which discrete Schottky diodes are co-packaged with discrete power MOSFET devices. There have also been monolithic implementations of power MOSFETs with Schottky diode. Korman et al., for example, disclose in U. S. Pat. No. 5,111,253 a planar vertical double diffused MOSFET (DMOS) device with a Schottky barrier structure. A similar structure is described by Cogan in U.S. Pat. No. 4,811,065 where again a Schottky diode is monolithically integrated on the same silicon substrate as a lateral DMOS device. These devices, however, have been limited to planar power MOSFET technology. The monolithic Schottky diode structures used in these types of devices do not lend themselves well to power MOSFET devices using trench technology.

There is therefore a need for monolithically integrated Schottky diode together with a trenched gate MOSFET device and methods of manufacture thereof.

SUMMARY OF THE INVENTION

The present invention provides methods and structures for monolithic integration of a Schottky diode together with a high performance trenched gate MOSFET. Broadly, this invention intersperses a MOS enhanced Schottky diode structure throughout the trench MOSFET cell array to enhance the performance characteristics of the MOSFET switch. The forward voltage drop is reduced by taking advantage of the low barrier height of the Schottky structure. In addition, this diode will have an inherent reverse recovery speed advantage compared to the normal pn junction of the vertical power MOSFET. The invention uses features of the trench process to optimize the performance of the Schottky diode. In a specific embodiment, the width of the trench is adjusted such that depletion in the drift region of the Schottky is influenced and controlled by the adjacent MOS structure to increase the reverse voltage capability of the Schottky diode.

Accordingly, in one embodiment, the present invention provides a monolithically integrated structure combining a field effect transistor and a Schottky diode on a semiconductor substrate, including: a trench extending into the substrate and forming a gate electrode of the field effect transistor; a pair of doped source regions positioned adjacent to and on opposite sides of the trench and inside a doped body region, the doped source regions forming a source electrode of the field effect transistor and the substrate forming a drain electrode of the field effect transistor; and a Schottky diode having a barrier layer formed on the surface of the substrate and between a pair of adjacent diode trenches extending into the substrate, the pair of adjacent diode trenches being separated by a distance W.

In another embodiment, the present invention provides a monolithically integrated structure combining a field effect transistor and a Schottky diode on a semiconductor substrate, including: first and second trenches extending into the substrate and forming a gate electrode of the field effect transistor; each of the first and second trenches having a pair of doped source regions positioned adjacent to and on opposite sides of the trench and inside a doped body region, the doped source regions forming a source electrode of the field effect transistor and the substrate forming a drain electrode of the field effect transistor; and a Schottky diode having a barrier layer formed on the surface of the substrate between the first and second trenches and disposed between two doped body regions parallel to the longitudinal axis of each trench. A variation of this embodiment increases the width of the first and the second trench at either sides of the barrier layer.

In yet another embodiment, the present invention provides a method of manufacturing a trench field effect transistor and a Schottky diode on a semiconductor substrate, including the steps of: forming a plurality of trenches extending into the substrate, with a first trench being adjacent to a second trench, and the second being adjacent to a third trench; forming a layer of conductive material inside the plurality of trenches, the layer of conductive material being isolated from trench walls by a dielectric layer; forming a doped body region extending into the substrate between the first and the second trenches and not between the second and the third trenches; forming doped source regions inside the doped body region and adjacent to the walls of the first and the second trenches; and forming a conductive anode layer on the surface of the substrate between the second and the third trenches, whereby a field effect transistor is formed with the substrate providing a drain terminal, the doped source regions a source terminal and the conductive layer in the first and the second trenches a gate terminal, and a Schottky diode is formed with the substrate providing a cathode terminal and the conductive anode layer providing an anode terminal.

A better understanding of the nature and advantages of the monolithically integrated trench MOSFET and Schottky diode according to the present invention may be gained with reference to the detailed description below and the accompanying drawings.

BRIEF DESCRIPTION OF THE DRAWINGS

FIG. 6 shows a different embodiment for the integrated trench MOSFET-Schottky diode structure of the present invention wherein the Schottky diode is interspersed alternately in parallel with the longitudinal axis of the trenches in an exemplary open-cell trench process; and FIGS. 7A and 7B show top view of two alternative embodiments for the structure shown in FIG. 6.

DESCRIPTION OF THE SPECIFIC EMBODIMENTS

Figure 2:
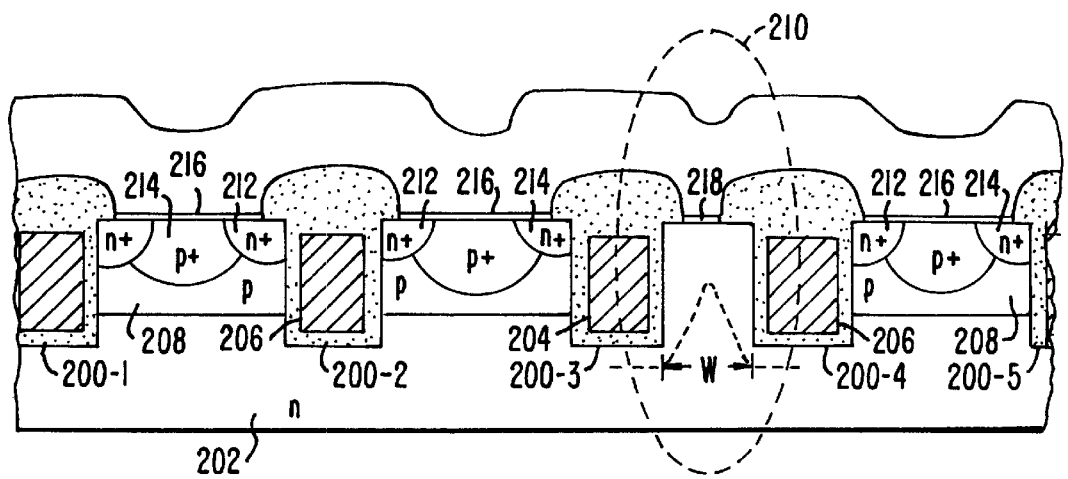
FIG. 2 shows a cross-sectional view of an exemplary embodiment for the integrated trench MOSFET-Schottky diode structure according to the present invention.

Referring to FIG. 2, there is shown a cross-sectional view of a simplified example of an integrated trench MOSFET-Schottky diode structure fabricated on a silicon substrate 202 according to the present invention. A plurality of trenches 200 are patterned and etched into substrate 202. Substrate 202 may comprise an n-type epitaxial upper layer (not shown). A thin layer of dielectric 204 (e.g., silicon dioxide) is formed along the walls of trenches 200, after which conductive material 206 such as polysilicon is deposited to substantially fill each trench 200. A p-type well 208 is then formed between trenches 200 except between those trenches (e.g., 200-3 and 200-4) where a Schottky diode is to be formed. Thus, the regions 210 between trenches 200-3 and 200-4 where a Schottky diode is to be formed is masked during the p-well implant step. N+source junctions 212 are then formed inside p-well regions 208, either before or after the formation of a p+heavy body regions 214. A layer of conductive material 216 such as titanium tungsten (TiW) or titanium nitride (TiNi) is then patterned and deposited on the surface of the substrate to make contact to n+source junctions 212. The same material is used in the same step to form anode 218 of Schottky diode 210. Metal (e.g., aluminum) is then deposited on top to separately contact MOSFET source regions 212 as well as p+heavy body 216 and Schottky anode 218. A preferred process for the trench MOSFET of the type shown in the exemplary embodiment of FIG. 2, is described in greater detail in commonly-assigned U.S. patent application No. 08/970,221, titled "Field Effect Transistor and Method of its Manufacture, " by Bencuya et al., which is hereby incorporated by reference in its entirety. It is to be understood, however, that the teachings of the present invention apply to other types of trench processes with, for example, different body structures or trench depths, different polarity implants, closed or open cell structures, etc.

Figure 1:
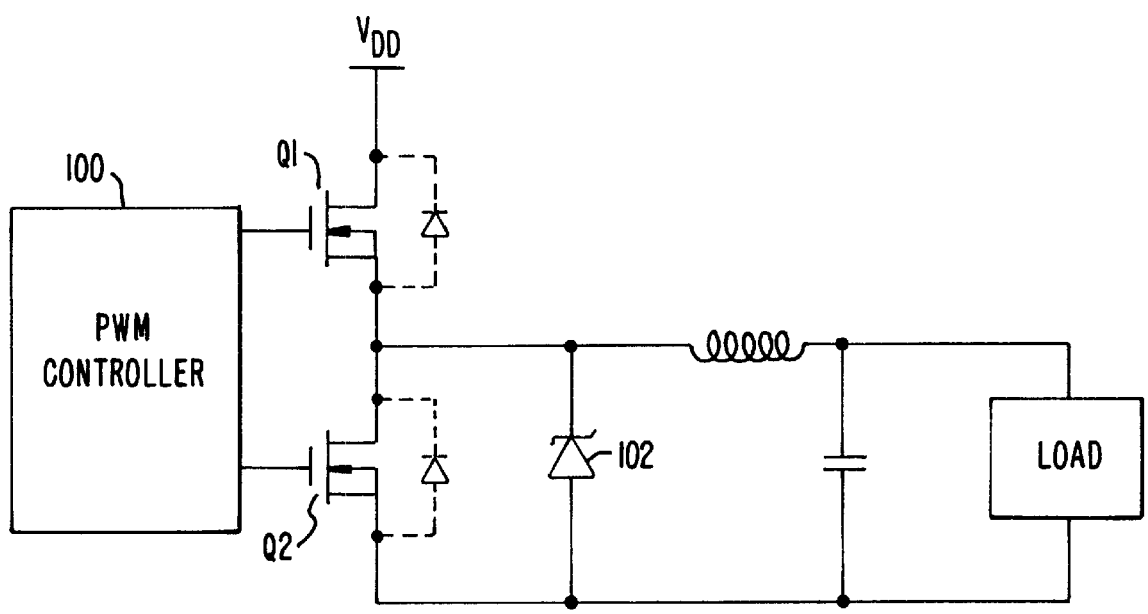
FIG. 1 is a simplified circuit schematic for a dc/dc converter using power MOSFETs with a Schottky diode.

The resulting structure, as shown in FIG. 2, includes a Schottky diode 210 that is formed between two trenches 200-3 and 200-4 surrounded by trench MOSFET devices on either side. N-type substrate 202 forms the cathode terminal of Schottky diode 210 as well as the drain terminal of the trench MOSFET (see FIG. 1). Conductive layer 218 provides the diode anode terminal that connects to the source terminal of the trench MOSFET. In this embodiment, the polysilicon in trenches 200-3 and 200-4 connects to the gate polysilicon (206) of the trench MOSFET and is therefore similarly driven. The Schottky diode as thus formed has several operational advantages. As voltage builds on the cathode of the Schottky diode (i.e., substrate 202), the MOS structure formed by the poly filled trenches 200-3 and 200-4 forms a depletion region. This helps reduce the diode leakage current. Furthermore, the distance W between trenches 200-3 and 200-4 can be adjusted such that the growing depletion regions around each trench 200-3 and 200-4 overlap in the middle. This pinches off the drift region between Schottky barrier 218 and the underlying substrate 202. The net effect is a significant increase in the reverse voltage capability of the Schottky diode with little or no detrimental impact on its forward conduction capability.

Figure 3:
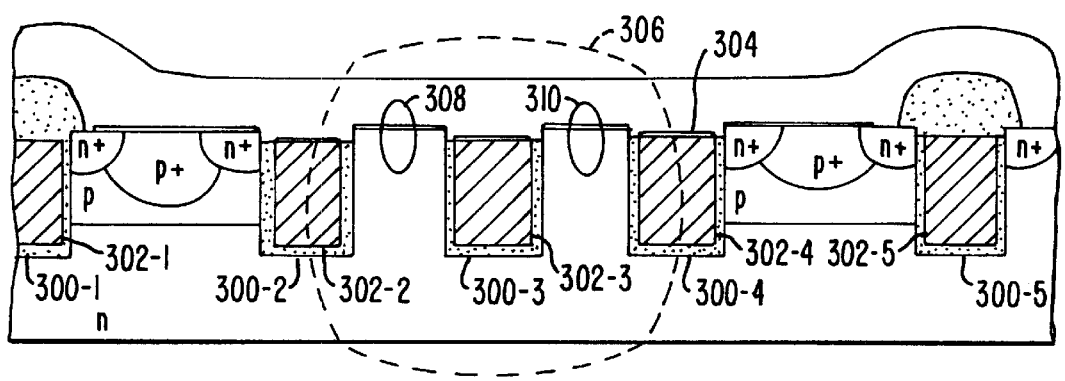
FIG. 3 shows a cross-sectional view of another exemplary embodiment for the integrated trench MOSFET-Schottky diode structure according to the present invention.

In a preferred embodiment, the distance W between trenches 200-3 and 200-4, or the width of the mesa wherein the Schottky diode is formed, is smaller than inter-trench spacing for MOSFETs. The distance W can be, for example, 0.5 μm depending on doping in the drift region and the gate oxide thickness. The opening in which anode contact 218 is formed is even smaller than W, which may test the limits of the manufacturing process. To allow for greater manufacturing process flexibility, the present invention provides an alternate embodiment in FIG. 3. Referring to FIG. 3, a trench MOSFET-Schottky diode structure is shown that is similar to that shown in FIG. 2 except for two variations. The first variation relates to facilitating the manufacturing process by enlarging the anode contact area. This is accomplished by isolating the polysilicon layers (302-2, 302-3, 302-4) inside the trenches between which the Schottky diode is formed, from the gate polysilicon layers for the trench MOSFET devices. These isolated trench polysilicon layers (302-2, 302-3, and 302-4) can then be exposed when depositing the anode conductive layer 304. Thus, instead of a narrow contact area, this structure allows for a large anode contact area that connects to Schottly trench polysilicon layers as well as the trench MOSFET source terminal.

Figure 5A:
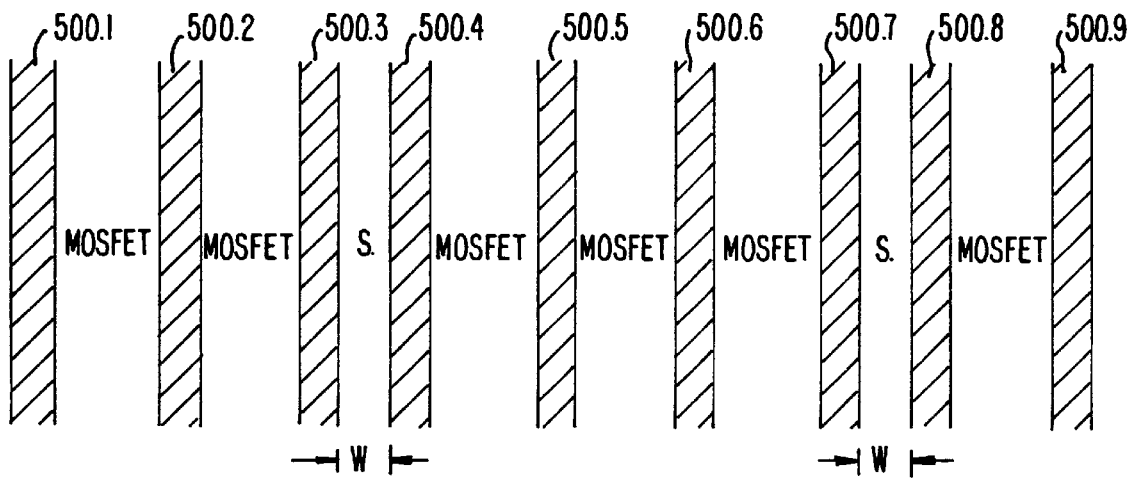
FIGS. 5A and 5B show top views of the integrated trench MOSFET-Schottky diode structure for the embodiments shown in FIGS. 2 and 3, respectively, assuming an exemplary open-cell trench MOSFET process.
Figure 5B:
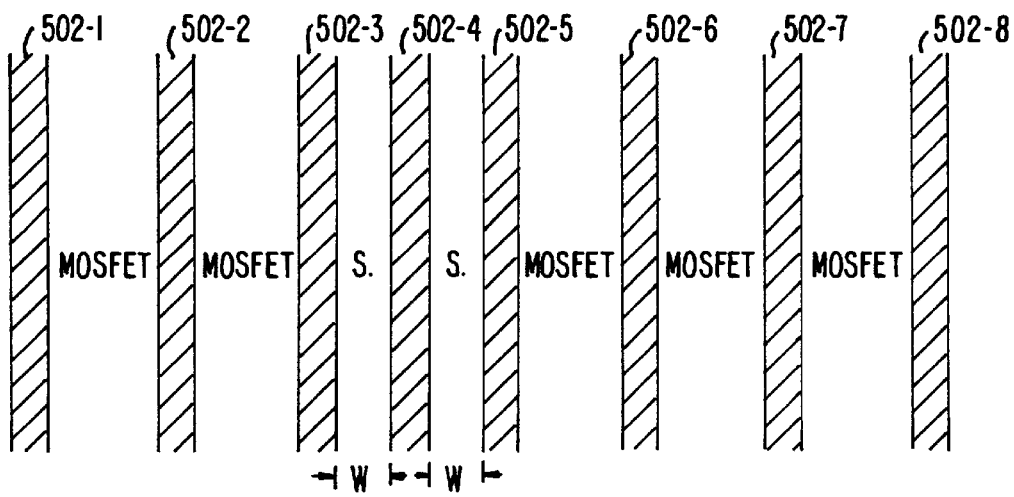

The second variation is in the number of adjacent trenches used to form the Schottky diode (306), a number that is strictly arbitrary. As shown in FIG. 3, two parallel Schottky diode mesas 308 and 310 are formed between three trenches 302-2, 302-3, and 302-4. Since the area of the Schottky diode determines its forward voltage drop in response to current, Schottky structures with different numbers of adjacent trenches can be devised to arrive at the desired area. A two-mesa structure is shown in FIG. 3 for illustrative purposes only, and the embodiment shown in FIG. 3 could use a single mesa as in FIG. 2, or more than two parallel mesas. Similarly, the embodiment shown in FIG. 2 could use two or more parallel mesas to implement the Schottky diode. To better understand this aspect of the invention, FIGS. 5A and 5B provide simplified top views of the embodiments shown in FIGS. 2 and 3, respectively. In these drawings, an exemplary open-cell trench MOSFET process is assumed where trenches extend in parallel. FIG. 5A illustrates nine trenches 500-1 to 500-9 where a single-mesa Schottky diode is provided between trenches 500-3 and 500-4 and another one is provided between trenches 500-7 and 500-8. An active trench MOSFET is formed between all other trenches. FIG. 5B shows eight trenches 502-1 to 502-8 where a double-mesa Schottky diode is formed between trenches 502-3, 502-4, and 502-5. As shown in both figures the distance W between the Schottky trenches is smaller than the other inter-trench spacings.

Figure 4:
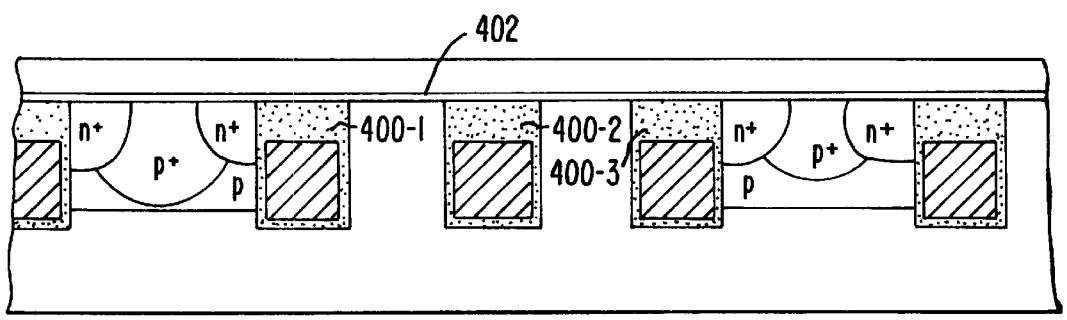
FIG. 4 is a cross-sectional view of yet anther exemplary embodiment for the integrated trench MOSFET-Schottky diode structure according to the present invention.

An alternative embodiment to that shown in FIG. 3 for isolating Schottky trench polysilicon layers is shown in FIG. 4. According to this embodiment, the polysilicon layers filling the trenches are recessed and covered by a dielectric (e.g., oxide) layer 400. Thus, when the Schottky anode/MOSFET source metal layer 402 is deposited, poly layers 400-1, 400-2 and 400-3 remain isolated. The poly in the recessed trenches can thus float or connect to the gate poly inside MOSFET trenches.

In yet another embodiment, the present invention intersperses the Schottky diode structure between MOSFET structures in the mesa regions between trenches, parallel to the longitudinal axis of the trenches. FIG. 6 shows a Schottky diode structure viewed along a cross-section of a mesa formed by two adjacent trenches. As shown in FIG. 6, the mesa is divided into multiple p-well regions 600 inside which p+heavy body 602 and n+source region 604 reside, and between which a Schottky diode 606 is formed by the junction of metal layer 608 and n-type substrate 610. This embodiment yields not only a very small pitch low resistance trench gate MOSFET, but it also allows for the integration of a low $V_F$ diode. FIG. 7A provides a simplified top view of the integrated trench MOSFET-Schottky diode structure according to this embodiment of the present invention. In the embodiment shown in FIG. 7A, the distance W between trenches remains the same for the Schottky structure. To improve the Schottky performance, in a preferred embodiment, the trench width can be modified in the Schottky regions to reduce W. This is shown in FIG. 7B where the trenches in the interspersed Schottky structure widen to reduce the width of the mesa resulting in a smaller W for the Schottky diodes.

Accordingly, the present invention provides various embodiments for a monolithically integrated Schottky diode and trench MOSFET where the Schottky diode performance is improved by trenches with field effect action. A performance trade off is introduced by the method and structure of the present invention in that by enhancing the Schottky diode performance with a trench MOS structure, additional input capacitance is adversely incorporated into the MOSFET. This additional capacitance degrades the switching performance of the MOSFET to some extent. However, in many applications such a trade off is acceptable. For example, in the dc-dc converter application shown in FIG. 1, switching loss in the lower transistor Q2 does not contribute that significantly to the overall conversion efficiency of the circuit.

In conclusion, the present invention provides methods and structure for a monolithically integrated Schottky diode and trench MOSFET. By distributing a Schottky diode within the cell array of the trench MOSFET, the overall switching characteristics of the MOSFET body diode is improved. While the above is a complete description of specific embodiments of the present invention, it is possible to use various alternatives, modifications and equivalents. For example, the techniques taught by the present invention can be employed in trench processes using either an open-call or a closed-cell structure. Therefore, the scope of the present invention should be determined not with reference to the above description but should, instead, be determined with reference to the appended claims, along with their full scope of equivalents.

What is claimed is:

1. A monolithically integrated structure combining a field effect transistor and a Schottky diode on a semiconductor substrate, comprising:

a first trench extending into the substrate and substantially filled by conductive material forming a gate electrode of the field effect transistor;

a pair of doped source regions positioned adjacent to and on opposite sides of the trench and inside a doped body region, the doped source regions forming a source electrode of the field effect transistor, and the substrate forming a drain electrode of the field effect transistor; and a Schottky diode having a barrier layer formed on the surface of the substrate and between a pair of adjacent trenches extending into the substrate, the pair of adjacent trenches being substantially filled by conductive material and being separated by a distance W, wherein the conductive material in each trench is separated from trench walls by a thin layer of dielectric, and wherein the integrated structure further comprises a second trench adjacent to the first trench, the second trench forming the gate electrode of the field effect transistor in a similar fashion to the first trench, and wherein a distance between the first trench and the second trench is greater than the distance W, and wherein the barrier layer and a metal layer contacting the source regions of the field effect transistor comprise one of either titanium tungsten or titanium nitride.

2. The monolithically integrated structure of claim 1 wherein the barrier layer and the metal layer contacting the source regions connect together by an overlying layer of aluminum.

3. The monolithically integrated structure of claim 1 wherein the conductive material in the first and second trenches electrically connects to the conductive material in the pair of adjacent trenches between which the Schottky diode is formed.

4. The monolithically integrated structure of claim 1 wherein the conductive material in the pair of adjacent trenches between which the Schottky diode is formed is electrically isolated from the conductive material in the first and second trenches.

5. The monolithically integrated structure of claim 4 wherein the metal forming the barrier layer also covers and connects to the conductive material in the pair of adjacent trenches between which the Schottky diode is formed.

6. The monolithically integrated structure of claim 4 wherein the conductive material in the pair of adjacent trenches between which the Schottky diode is formed, is recessed into the pair of adjacent trenches and covered by a layer of dielectric material.

7. A monolithically integrated structure combining a field effect transistor and a Schottky diode on a semiconductor substrate, comprising a plurality of trenches extending in parallel and into the substrate forming a corresponding plurality of mesas therebetween, the plurality of trenches being substantially filled by a conductive material that is separated from trench walls by a thin layer of dielectric material;

a doped well region formed inside the plurality of mesas except for at least one mesa;

a pair of doped source regions formed on the surface of the substrate in each doped well region and adjacent to trench walls; and a layer of metal formed on the surface of the substrate on the plurality of mesas to connect to the pair of doped source regions, the layer of metal also forming a barrier layer on the surface of the at least one mesa, wherein, the layer of metal connecting to the pair of doped source regions forms a source terminal of the field effect transistor, the substrate forms a drain terminal of the field effect transistor, and the conductive material in the plurality of trenches forms a gate terminal of the field effect transistor, and wherein, the layer of metal forming a barrier layer on the surface of the at least one mesa comprises an anode terminal of a Schottky diode and the substrate forms a cathode terminal of the Schottky diode.

8. The monolithically integrated structure of claim 7 wherein a width of the at least one mesa is smaller than a width of the remaining plurality of mesas.

9. The monolithically integrated structure of claim 8 wherein the conductive material substantially filling the plurality of trenches comprises polysilicon, and the layer of metal comprises titanium tungsten.

10. The monolithically integrated structure of claim 8 wherein the conductive material substantially filling the plurality of trenches are electrically connected.

11. The monolithically integrated structure of claim 8 wherein the conductive material inside trenches forming the at least one mesa is electrically isolated from conductive material inside the remaining plurality of trenches.

12. The monolithically integrated structure of claim 11 wherein the conductive material inside trenches forming the at least one mesa is electrically connected to the source terminal of the field effect transistor.

13. The monolithically integrated structure of claim 12 wherein the conductive material inside trenches forming the at least one mesa is recessed into the trench and covered by a layer of dielectric material.

14. A monolithically integrated structure combining a field effect transistor and a Schottky diode on a semiconductor substrate, comprising a plurality of trenches extending in parallel and into the substrate forming a corresponding plurality of mesas therebetween, the plurality of trenches being substantially filled by a conductive material that is separated walls by a thin layer of dielectric material;

a plurality of doped well regions formed inside each of the plurality of mesas;

a pair of doped source regions formed on the surface of the substrate in each doped well region and adjacent to trench walls; and a layer of metal formed on the surface of the substrate on the plurality of mesas and contacting the pair of doped source regions, the layer of metal also forming a barrier layer on the surface of substrate between a pair of adjacent doped well regions on a mesa, wherein, the layer of metal contacting the pair of doped source regions forms a source terminal of the field effect transistor, the substrate forms a drain terminal of the field effect transistor, and the conductive material in the plurality of trenches forms the gate terminal of the field effect transistor, and wherein, the layer of metal forming the barrier layer on the surface of the substrate comprises an anode terminal of a Schottky diode and the substrate forms a cathode terminal of the Schottky diode.

15. The monolithically integrated structure of claim 14 wherein at each location where the barrier metal is formed, the corresponding mesa is made narrower by increasing the width of trenches on either side.

16. A method of manufacturing a trench field effect transistor and a Schottky diode on a semiconductor substrate, comprising the steps of:

forming a plurality of trenches extending into the substrate, with a first trench being adjacent to a second trench, and the second being adjacent to a third trench;

forming a layer of conductive material inside the plurality of trenches, the layer of conductive material being isolated from trench walls by a dielectric layer;

forming a doped body region extending into the substrate between the first and the second trenches and not between the second and the third trenches;

forming doped source regions inside the doped body region and adjacent to the walls of the first and the second trenches; and forming a conductive anode layer on the surface of the substrate between the second and the third trenches, and also between the first and second trenches, whereby a field effect transistor is formed with the substrate providing a drain terminal, the doped source regions a source terminal and the conductive layer in the first and the second trenches a gate terminal, and a Schottky diode is formed with the substrate providing a cathode terminal and the conductive anode layer providing an anode terminal.

17. A method of manufacturing a trench field effect transistor and a Schottky diode on a semiconductor substrate, comprising the steps of:

forming a plurality of trenches extending into the substrate;

forming a layer of conductive material inside the plurality of trenches, the layer of conductive material being isolated from trench walls by a dielectric layer;

forming a plurality of doped body regions extending into the substrate between each adjacent pair of trenches;

forming doped source regions inside the doped body regions and adjacent to the walls of the adjacent pair of trenches; and forming a conductive anode layer on the surface of the substrate between the plurality of doped body regions and contacting the doped source regions, whereby an interspersed field effect transistor-Schottky diode structure is formed with the substrate providing a drain terminal, the doped source regions a source terminal and the conductive layer in the first and the second trenches a gate terminal of the field effect transistor, and the substrate providing a cathode terminal and the conductive anode layer providing an anode terminal of the Schottky diode.

18. The method of claim 17 further comprising:

forming an overlying metal layer on the conductive anode layer.

19. A monolithically integrated structure combining a field effect transistor and a Schottky diode on a semiconductor substrate, comprising:

a first trench extending into the substrate and substantially filled by conductive material forming a gate electrode of the field effect transistor;

a pair of doped source regions positioned adjacent to and on opposite sides of the trench and inside a doped body region, the doped source regions forming a source electrode of the field effect transistor, and the substrate forming a drain electrode of the field effect transistor;

a Schottky diode having a barrier layer comprising metal formed on the surface of the substrate, between a pair of adjacent trenches extending into the substrate, and wherein the barrier layer also contacts the source electrode of the field effect transistor, the pair of adjacent trenches being substantially filled by conductive material and being separated by a distance W; and an overlying metal contacting the barrier layer.

20. The monolithically integrated structure of claim 19 wherein the barrier layer is on a mesa between the pair of adjacent trenches.

21. The monolithically integrated structure of claim 19 wherein a portion of the semiconductor substrate disposed directly under the barrier layer comprises an n-type semiconductor material.

22. The monolithically integrated structure of claim 19 wherein the barrier layer also contacts the conductive material within the pair of adjacent trenches.

23. The monolithically integrated structure of claim 19 wherein the barrier layer is substantially planar and extends over the conductive material in the pair of adjacent trenches.

24. The method of claim 23 wherein the overlying metal layer comprises aluminum and the barrier layer comprises titanium tungsten or titanium nitride.

* * * * *

UNITED STATES PATENT AND TRADEMARK OFFICE
CERTIFICATE OF CORRECTION

PATENT NO. : 6,351,018 B1
DATED : February 26, 2002
INVENTOR(S) : Steven Paul Sapp It is certified that error appears in the above-identified patent and that said Letters Patent is hereby corrected as shown below:

Column 8,
Line 7, after "separated" insert -- from trench --.
Line 17, after "of" insert -- the --.

Signed and Sealed this

Fifteenth Day of October, 2002

Attest:

JAMES E. ROGAN
Attesting Officer    Director of the United States Patent and Trademark Office